US006771026B2

(12) United States Patent
Vukovic (10) Patent No.: US 6,771,026 B2
(45) Date of Patent: Aug. 3, 2004

(54) PLASMA GENERATION BY MODE-CONVERSION OF RF-ELECTROMAGNETIC WAVE TO ELECTRON CYCLOTRON WAVE

(75) Inventor: Mirko Vukovic, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 42 days.

(21) Appl. No.: 10/170,320

(22) Filed: Jun. 12, 2002

(65) Prior Publication Data

US 2003/0232151 A1 Dec. 18, 2003

(51) Int. Cl.[7] .................................................. H01J 7/24
(52) U.S. Cl. ............................ 315/111.41; 315/111.71; 315/111.21; 118/723 MR; 118/723 MA
(58) Field of Search ...................... 315/111.21, 111.41, 315/111.71, 111.51, 111.81, 502; 118/723 MR, 723 MA, 723 R; 156/345.46, 345.48, 345.49

(56) References Cited

U.S. PATENT DOCUMENTS

| | | | | |
|---|---|---|---|---|
| 5,017,835 A | * | 5/1991 | Oechsner | 315/111.81 |
| 5,146,137 A | * | 9/1992 | Gesche et al. | 315/111.21 |
| 5,274,306 A | | 12/1993 | Kaufman et al. | 315/111.41 |
| 5,587,038 A | | 12/1996 | Cecchi et al. | 156/345 |
| 5,648,701 A | | 7/1997 | Hooke et al. | 315/111.21 |
| 5,718,795 A | | 2/1998 | Plavidal et al. | 156/345 |
| 5,767,628 A | | 6/1998 | Keller et al. | 315/111.51 |
| 6,000,360 A | | 12/1999 | Koshimizu | 118/723 E |
| 6,245,190 B1 | * | 6/2001 | Masuda et al. | 156/345.46 |

OTHER PUBLICATIONS

Chen, *Helicon Plasma Sources*, O.A. Popov (ed.), High Density Plasma Sources, Materials Science and Process Technology Series, Noyes Publications (1995), Chapter 8, pp. 1–75.

Nisoa, *Compact High–Density Plasma Source Produced by using Standing Helicon Waves*, Jpn. J. Appl. Phys., vol. 38 (1999) Pt. 2, 7A, pp. 777–779.

Shinohara, *Helicon m=0 Mode Characteristics in Large–Diameter Plasma Produced by a Planar Spiral Antenna*, Plasma Phys. Control. Fusion 39 (1997), pp.1479–1486.

Stevens, *Helicon Plasma Source Excited by a Flat Spiral Coil*, J. Vac. Sci. Technol. A 13(5), Sep./Oct. 1995, pp. 2476–2482.

Katyukha, *Helicon Ion Source for Plasma Processing*, Rev. Sci. Instrum. 65(4), Apr. 1994, pp. 1368–1370.

Kwak, *Frequency Dependence of the Plasma Density for Helicon Plasmas*, Phys. Plasmas 4(5), May 1997, pp. 1463–1467.

* cited by examiner

*Primary Examiner*—Haissa Philogene
(74) *Attorney, Agent, or Firm*—Wood, Herron & Evans, L.L.P.

(57) ABSTRACT

A method of plasma generation is provided in which the application of a static magnetic field perpendicular to the direction of the RF electric field allows for the propagation of an electromagnetic wave from a coil outside the chamber, through a dielectric window and into the plasma. The RF electric field and the DC magnetic field are both in the plane of the dielectric window in what may be called a planar helicon configuration. Due to magnetic field effects, the electromagnetic wave excites an electron cyclotron wave that heats the electrons by mode conversion of the whistler wave a few centimeters from the dielectric window where a mode conversion relationship among characteristic antenna wavelength, generator frequency, magnetic field strength and plasma electron density is satisfied. The curvature of the magnetic field lines generates plasma flows that expel the plasma towards the processing space.

16 Claims, 9 Drawing Sheets

PLASMA GENERATION BY MODE-CONVERSION OF RF-ELECTROMAGNETIC WAVE TO ELECTRON CYCLOTRON WAVE

This invention relates to the semiconductor wafer plasma processing and particularly to the generation of high density plasma for such processing.

BACKGROUND OF THE INVENTION

The dominant plasma sources in the semiconductor equipment industry are of the capacitive and inductive type. Their attractiveness lies in their simplicity. In both of these sources, the RF electric field directly excites electron currents in the plasma. Collisions between the electrons and neutrals heat the electrons by randomizing their energies. In capacitive sources, the plasma source also provides the RF bias to the wafer or substrate, which is usually necessary in processing of high aspect ratio features. The drawbacks of such capacitive sources are lack of independent control of plasma density and wafer bias. In addition, the presence of large voltage swings in the plasma results in a population of energetic electrons that can lead to device damage. Inductive sources, on the other hand, offer the additional degree of freedom of decoupling the plasma source from the wafer bias. In addition, when the RF coil is physically removed from the plasma, these sources allow for production of higher plasma densities than do the capacitive sources. The one major drawback of these inductive sources is their reduced efficiency at high RF power fluxes. The increased plasma density reflects much of the RF energy back to the generator. The issue of electron damage is not removed either. But the damage can be controlled and reduced with careful design and a uniform plasma in contact with the wafer.

Plasma sources employing stationary magnetic fields have also been developed, but have not gained wide-spread acceptance. These include the electron-cyclotron source and the helicon source. Both of these rely on mode-conversion, which is a phenomenon in which an electro-magnetic wave launched from the outside of a vacuum chamber, either micro-wave or RF, excites an electro-static wave or standing wave at a resonance location in the plasma region within the chamber. The electro-static wave heats the electrons. The resonance location for ECR sources is the location where a particular wave frequency and magnetic field strength relationship is satisfied. For helicon sources, satisfying the resonance condition is more complex.

Both ECR sources and helicon sources have lacked acceptance. This can be attributed to the inherent complexity due to the need to generate large magnetic fields throughout the plasma generation space. The remnants of such fields can lead to plasma non-uniformity and damage to the wafer. Such a magnetic field at the wafer can be removed, but at the cost of additional source complexity. Helicon sources are capable of producing extremely high plasma densities. However, because of physical processes that have not been well understood, they exhibit complex behavior such as abrupt density jumps versus RF power, and operation over regions of magnetic field strength and RF power where the source operation is unstable and intermittent. Such behavior is believed to arise from the effects of boundary conditions on the propagation of the waves in the plasma.

More recently, surface wave plasma sources have been introduced. These vary in design, but their salient feature is the existence of a standing electro-magnetic wave on the boundary of the plasma with the dielectric. At a high enough plasma density, this standing electro-magnetic wave mode converts to the electron plasma wave that heats the electrons. With surface wave plasma sources, the mode-conversion location depends on the plasma density and RF frequency. As plasma density increases, the mode-conversion layer moves to the plasma edge, reducing the effectiveness of plasma generation. In this respect, surface wave sources are similar to inductively coupled plasma sources. The maximum achievable plasma density varies linearly with the RF frequency. In order to achieve useful plasma densities, surface wave plasma sources have RF frequencies starting in the range of 800 MHz and higher.

The need for a plasma energy source that efficiently couples energy into a high density plasma remains, particularly where low intensity magnetic field at a substrate is desired.

SUMMARY OF THE INVENTION

A primary objective of the present invention is to provide a plasma energy source that efficiently couples energy into a high density plasma, and, more particularly, which does so while maintaining at a low intensity the magnetic field at a substrate being processed by the plasma.

According to the principles of the present invention, a series of RF plasma sources is provided in which the RF electric field is perpendicular to the DC magnetic field and both are in the plane of the dielectric window through which the energy is coupled into the plasma. The energy deposition mechanism is via excitation of the electron cyclotron wave in the plasma. The configuration is such that excitation can be either directly at the plasma-dielectric interface or indirectly by mode conversion of the electromagnetic wave at some distance from the dielectric window. However, the parameters are maintained to exploit the postulated mechanism of mode conversion, and to do so combined with plasma flows in unstable magnetic field configurations, wherein the curvature of the magnetic field lines is such that plasma instabilities will be excited. These generate plasma flows that expel the plasma away from the dielectric window.

The present invention provides all of the advantage of the Helicon and ECR sources in utilizing mode conversion of the electro-magnetic wave to the electro-static wave in the presence of a magnetic field, while providing the ability to do so with reduced magnetic field at the wafer. Further, the invention can be implemented to avoid reduced efficiency at high RF power fluxes. The magnetic field is generated using relatively inexpensive permanent magnets. And unlike the helicon source, the invention does not produce density jumps as the RF power and magnetic field are varied.

These and other objectives and advantages of the present invention will be more readily apparent from the following detailed description.

DETAILED DESCRIPTION OF THE DRAWINGS

The present invention provides a plasma source that uses the processes that occur in the helicon type source and applies them to a planar geometry. The invention can be best understood from a description of the behavior of waves in magnetized plasmas and the ways in which the invention exploits the properties of these waves and the plasma generation mechanism of the helicon source. A magnetized plasma, in the context of this invention, is one where the magnetic field is strong enough for electrons to complete many cyclotron revolutions between collisions with the background gas or other charged particles. In the context of this invention, it is immaterial whether the ions are magnetized or not.

In general, within the domain of cold plasma wave theory, a magnetized plasma can support simultaneously two kinds of plasma waves, a long wavelength wave and a short wavelength wave. The long wavelength wave, which is also called fast wave, is mainly electromagnetic, that is, the energy in the wave oscillates between the electric and magnetic fields. The short wavelength wave, which is also called the slow wave, is mainly electrostatic, that is, the energy in the wave oscillates between the electric field and electron density fluctuations within the medium which is the plasma. The distinctions between the two types of waves is demonstrated in Table 1.

TABLE 1

Distinctions between the electromagnetic and electrostatic wave in helicon source plasma. The distinctions are relative to each other, and are often used to name the waves.

|  | Electromagnetic | Electrostatic |
| --- | --- | --- |
| Characteristic wavelength | Long (10 cm) | Short (<1 cm) |
| Phase velocity | Fast | Slow |
| Name in a helicon plasma | Helicon | TG wave |
| Name in unbounded plasma | Whistler | EC wave |
| Collisional damping | Weak | Strong |
| Polarization | $\parallel$ to $E_{RF}$ | $\perp$ to $E_{RF}$, $B_{DC}$ |

In the regime and bounded cylindrical geometry of helicon sources, the fast wave is called the helicon wave. In an unbounded plasma it is called a whistler wave. The source of the present invention is, from the wave point of view, an unbounded plasma, so the fast wave is referred to herein as the whistler wave. The slow wave is in general called the electron cyclotron, or EC, wave. In the cylindrical geometry of the helicon sources. It is called the Trivelpiece-Gould wave (TG wave for short). Herein it is referred to by its more general name, the EC wave.

Figure 1:
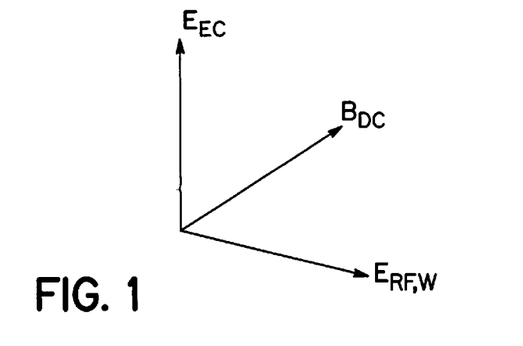
FIG. 1 is a perspective diagram illustrating the electric field polarization for whistler and EC waves.

Fast and slow waves are further distinguished by the polarization of their electric fields. Both types of waves have electric fields perpendicular to the background DC magnetic field $B_{DC}$. The electric field of the whistler wave is mainly in the direction of the exciting RF field, while that of the EC wave is in the direction perpendicular to that of $B_{DC}$ and $E_{RF}$, as illustrated in FIG. 1.

Further details of the field polarization depend on the antenna geometry, i.e., the mode of wave launch. In the classic helicon sources with Nagoya Type-III antennae, the electric field of the helicon wave is mainly radial, while the electric field of TG wave is azimuthal. Where helicon sources are used with loop antennae to generate a helicon plasma, the common requirement for a successful antenna is that the direction of the electric field induced in the plasma by the antenna be perpendicular to the direction of the static or DC magnetic field. In such sources, the electric field of the helicon wave is azimuthal, and the electric field of the TG wave is radial.

While the existence of the TG wave in a helicon plasma has been recognized. its importance in the generation of a helicon plasma has been re-evaluated only recently and is now believed to be the dominant power deposition channel in helicon sources. Its effectiveness resides in the large electron currents that are excited in the plasma in order to support the wave and that resistively heat the electrons. Because of its short wavelength, and large damping, the TG wave in helicon plasmas has not been observed directly and only indirect evidence exists such as measurement of increased optical emission near the plasma boundary adjacent to the antenna.

The TG waves in a helicon source can be excited directly or indirectly. The direct excitation occurs at the plasma edge and the indirect excitation occurs throughout the plasma volume. Direct excitation has been suggested to occur at the plasma edge, via a mechanism whereby, at the interface between the plasma and a dielectric boundary, the plasma RF currents must be zero. The TG wave is excited to cancel out the non-zero RF current of the helicon wave. The TG wave excited at the edge dissipates its power at the edge, and propagates little to the plasma interior. Due to the properties of the helicon wave, whose profile is determined by the bulk plasma density, the ratio of the power that goes into one type of wave or the other is then determined by the plasma density and profile. This dependence leads to the complex behavior of the helicon plasmas referred to above. The validity of this excitation mechanism depends on the details of the plasma behavior at the boundary. In case of a conductive boundary such as a Faraday shield or internal antenna, for example, the plasma RF current need not be zero. In such a case, the edge excitation of the TG wave would be suppressed.

The indirect excitation occurs via the process of mode conversion. In this process, one type of wave can transfer its energy to the other type. This type of energy transfer occurs at a location in the plasma where the plasma density, magnetic field strength, wave frequency and wavelength all satisfy the mode conversion condition for helicon and TG waves, which is:

$$\lambda = \frac{4.7 \times 10^{12} B}{\sqrt{n_e} \, f}$$

where $\lambda$ is the characteristic antenna wavelength in centimeters, f is the frequency of the generator in Hertz, B is the local magnetic field strength in Gauss and $n_e$ is the plasma density in electrons per square centimeter. This equation for the mode conversion condition is derived for an ideal case of wave propagation in an infinite and uniform plasma. In practice, a real antenna launches a spectrum of wavelengths into a non-uniform plasma. The excitation of the electro-static waves then occurs over a volume of space where the condition is approximately satisfied.

Figure 1A:
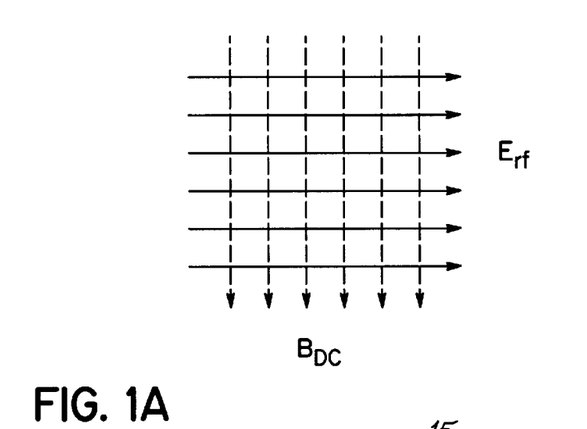
FIG. 1A is a diagram illustrating the general relationship between the RF electric field $E_{RF}$ and the DC magnetic field $B_{DC}$ in sources of the present invention.

The whistler and EC waves of an unbounded plasma are closely related to the helicon and TG waves of a cylindrical bounded plasma. Their polarization and mutual interaction are similar. As the plasma source of the present invention conforms more to the unbounded plasma model, it is described in terms of the whistler and EC waves. FIG. 1A illustrates a helicon wave of cylindrical geometries, which has its electric field $E_{rf}$ perpendicular to the background DC magnetic field $B_{DC}$.

Figure 2:
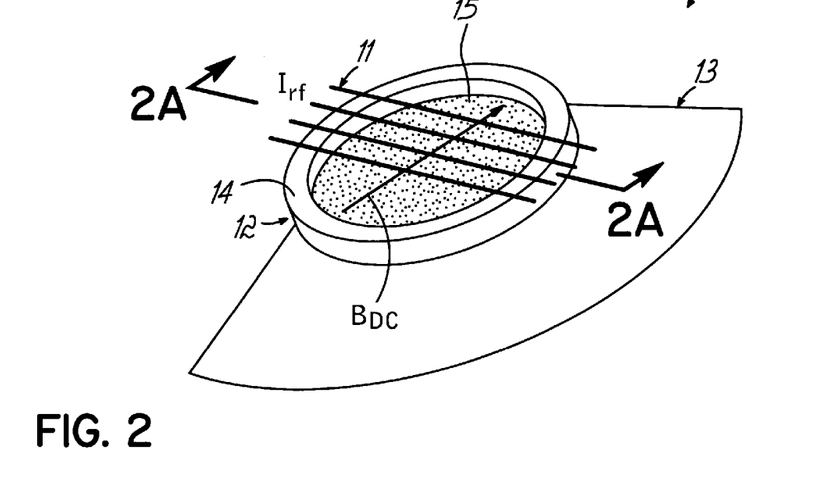
FIG. 2 is a perspective diagram of the basic layout of a source according to the present invention.

As shown in FIG. 2, a plasma processor 10 includes a source 12 that sits on top of the vacuum chamber 13. The source 12 includes a permanent magnet ring 14 that generates the uniform static or DC magnetic field $B_{DC}$. An RF coil 11 has conductors positioned adjacent a dielectric window 15 that seals an opening in the wall of the chamber 13. An optional Faraday shield 17 (FIG. 2A) may lie inside of the chamber 13 close to the window 15. RF current in coil 11 launches waves through the window 15 into the chamber 13. To prevent magnet over-heating from induced RF currents, the magnets of the ring 14 are shielded from the RF by a thin conductive layer of aluminum or copper foil several skin-depths thick.

The magnetic field strength in the opening 16 is in the order of 100 to 200 Gauss. The RF frequency is typically in the range of 2 to 13.56 MHz, and the opening 16 has a diameter approximately in the range of 5 to 20 cm. Since the electrons have to be magnetized, the electron temperature, magnetic field and gas density have to satisfy the relation:

$$B_{DC}[G] > 0.76 p[mToor]\sqrt{T_e[eV]}$$

The electron temperature is typically of the order of a few electron volts.

Figure 2A:
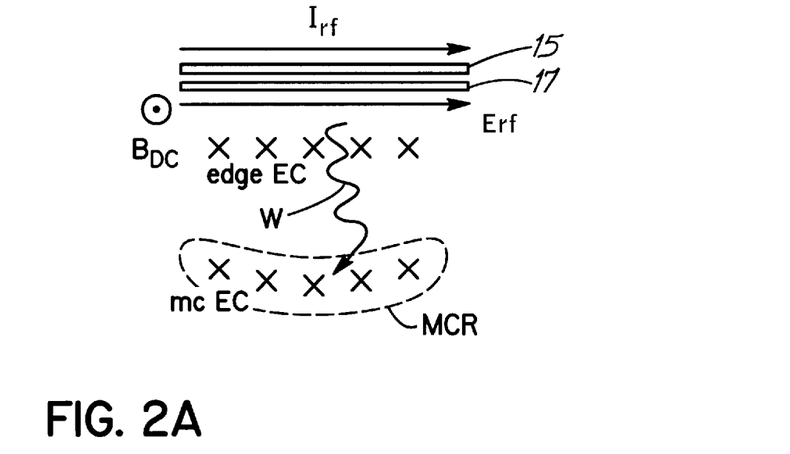
FIG. 2A is a cross-sectional view along the line 2A—2A of FIG. 2 schematically illustrating a mode conversion process.

The whistler waves are launched in a configuration where the RF current $I_{RF}$, is perpendicular to $B_{DC}$, as illustrated in FIG. 2A, which shows a schematic of the wave processes in a mode conversion source. Whistlerwave W is launched by $I_{RF}$ perpendicular to $B_{DC}$. The whistler wave W has its electric field $E_W$ perpendicular to $B_{DC}$. EC waves are generated at the plasma edge, edge EC, or at the mode-conversion region MCR, mc EC. The source generates a dense plasma next to the dielectric window 15 and optional Faraday shield 17. In contrast to ICP sources, this dense plasma does not mirror the RF energy back to the antenna or coil 11. Due to the magnetic field from the magnet ring 14, whistler waves propagate through the plasma to the mode conversion region MCR. Due to the curvature of magnetic field lines $B_{DC}$, plasma instabilities will create flows 20 that will enhance the transport of the plasma to the regions of lower magnetic field intensities (see FIG. 3B).

Figure 3:
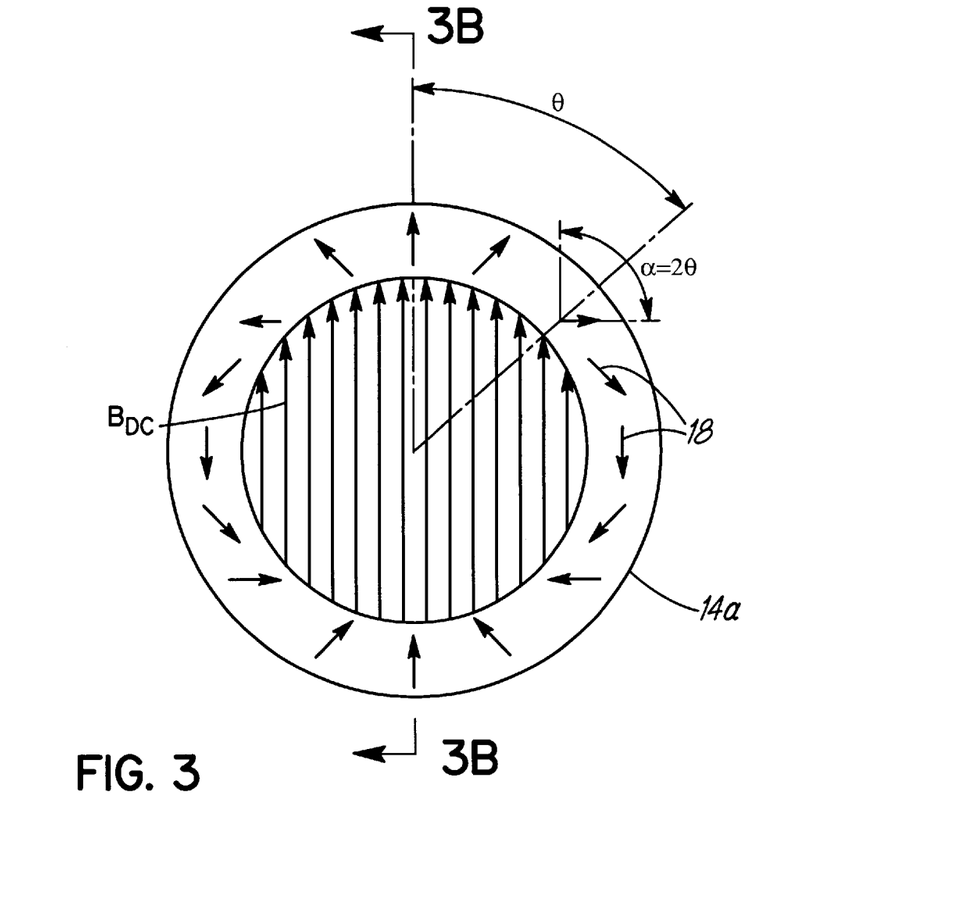
FIG. 3 is a top view of a ring magnet according to one embodiment of the invention.

Conceptually, the simplest way of generating $E_{RF}$ perpendicular to $B_{DC}$ is to generate $B_{DC}$ by passing a DC current through the RF coil 11. The magnitude of this current would be tens of Amperes, and the resulting power dissipation in the coil 11 would make this approach impractical. A permanent magnet design 14a as illustrated in FIG. 3, which was developed originally for high energy physics experiments, provides a magnetic field perpendicular to $E_{RF}$ of a plane antenna. The antenna is of the class of antennae having parallel current strips adjacent to the dielectric window as used in iPVD sources such as those described in U.S. patent application Ser. No. 09/442,600, filed Nov. 18, 1999 and U.S. patent application Ser. No. 09/629,515 filed Aug. 1, 2000, both hereby expressly incorporated herein by reference. To achieve the field distribution shown in FIG. 1A using permanent magnets, the magnet ring 14a has a magnetization arrangement illustrated by the arrows 18 in FIG. 3. The direction $\alpha$ of the magnetization arrows 18 is given by $\alpha = 2\theta$, where $\theta$ is the angular coordinate of the magnetized element, both $\alpha$ and $\theta$ being with respect to a common axis. The magnetization strength is constant throughout the magnet 14a.

Figure 3A:
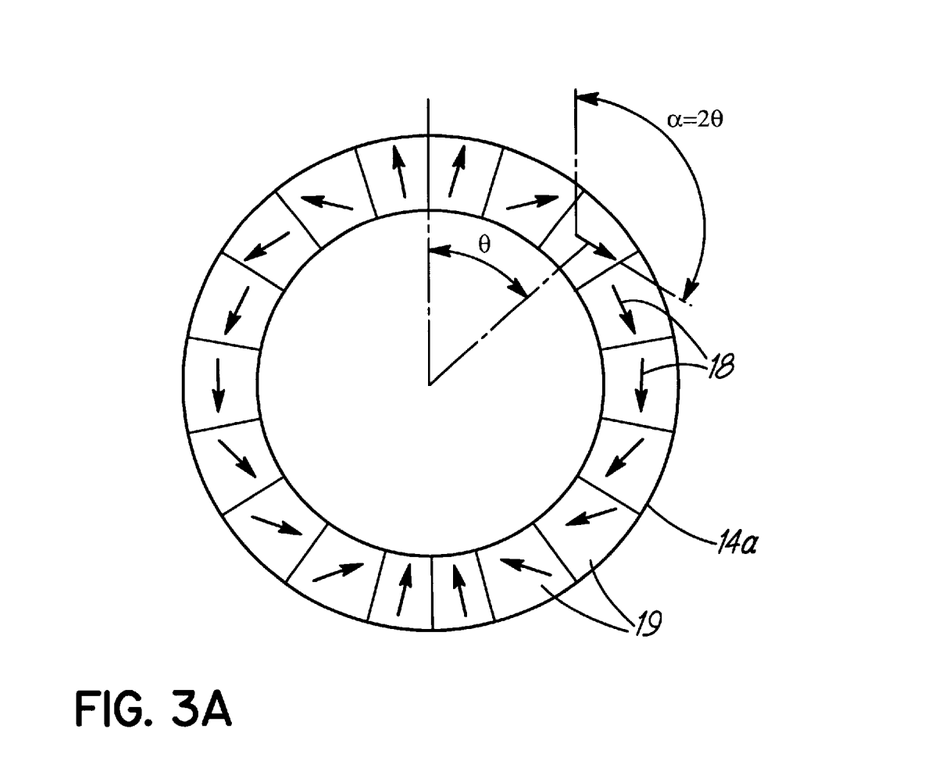
FIG. 3A is a view similar to FIG. 3 diagrammatically illustrating a segmented form of the magnet of FIG. 3A.
Figure 3B:
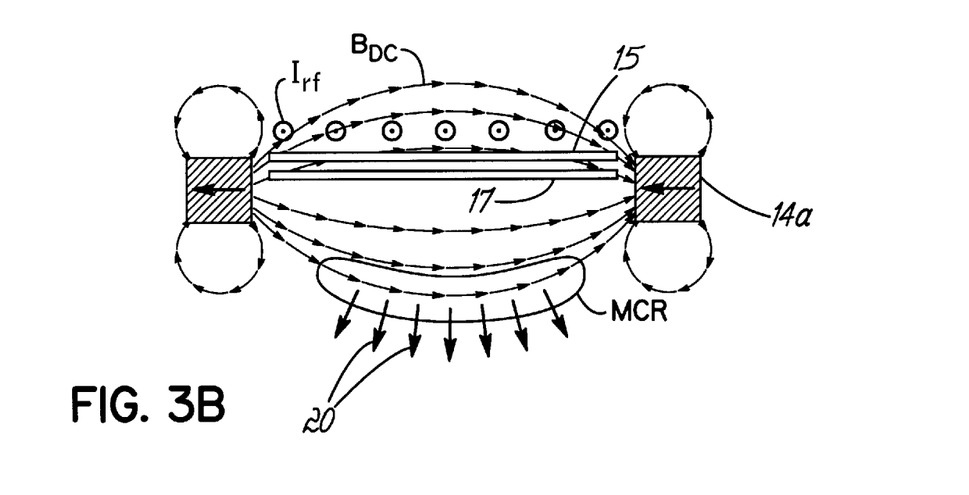
FIG. 3B is a cross-sectional view along the line 3B—3B of FIG. 3 illustrating field lines and plasma flow.
Figure 7:
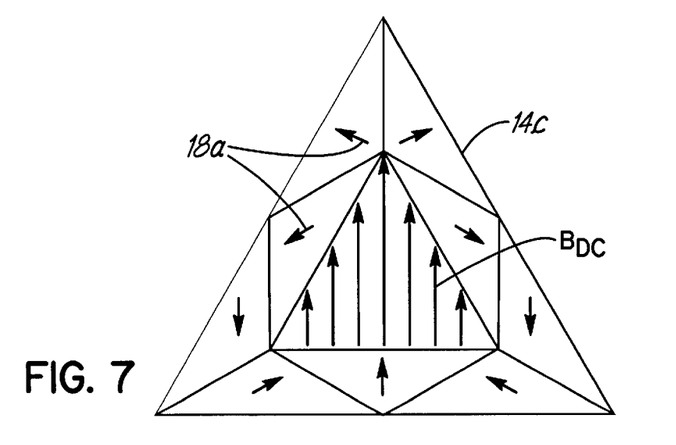
FIG. 7 is a view similar to FIG. 3A diagrammatically illustrating an alternative magnet configuration.
Figure 7A:
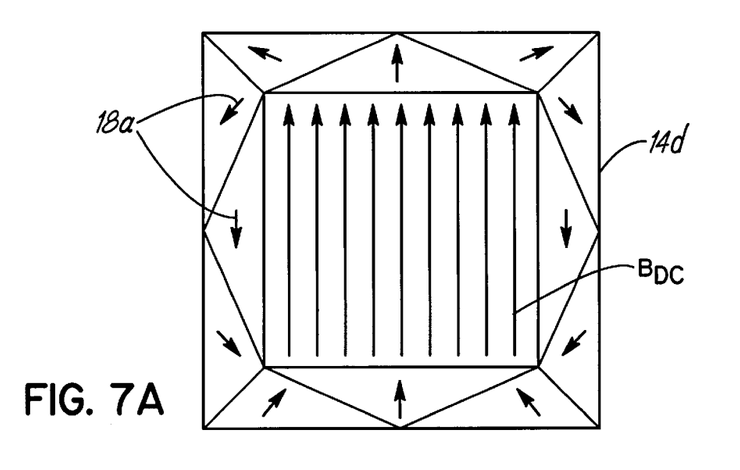
FIG. 7A is a view similar to FIG. 7 illustrating another alternative magnet configuration.
Figure 7B:
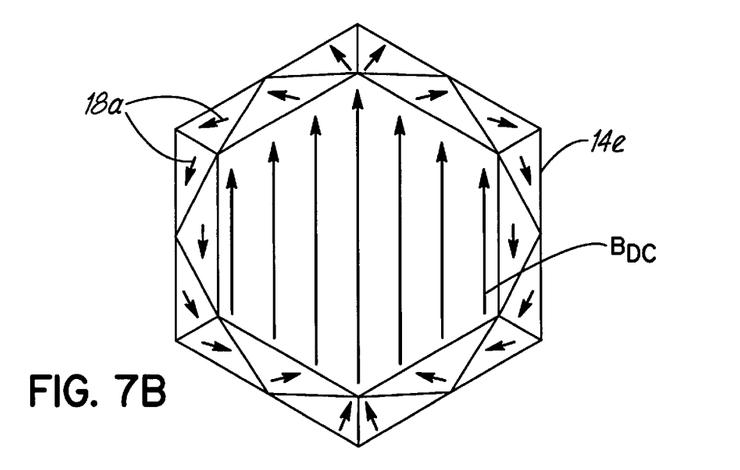
FIG. 7B is a view similar to FIGS. 7 and 7A illustrating still another alternative magnet configuration.

In practice, the magnetization distribution is achieved by assembling the magnet 14a out of many (e.g. 10 or more) sections 19 as in FIG. 3A. The magnet sections 19 are individually and equally magnetized in a direction given also by $\alpha = 2\theta$, where now $\theta$ is the angle of the centroid of each section 19. Alternative arrangements for uniform field distribution are possible and are further discussed in connection with FIGS. 7, 7A and 7B below. The magnetic field distribution in FIG. 3 is distorted outside the magnet 14a. The pattern of field lines $B_{DC}$ in the plane perpendicular to the magnet, denoted by line 3B—3B in FIG. 3, is shown in FIG. 3B. The field lines $B_{DC}$ are symmetric about the horizontal axis of symmetry. The figure depicts plasma flow 20 away from the source 12 due to instabilities generated by the curvature of the magnetic field $B_{DC}$.

Figure 4:
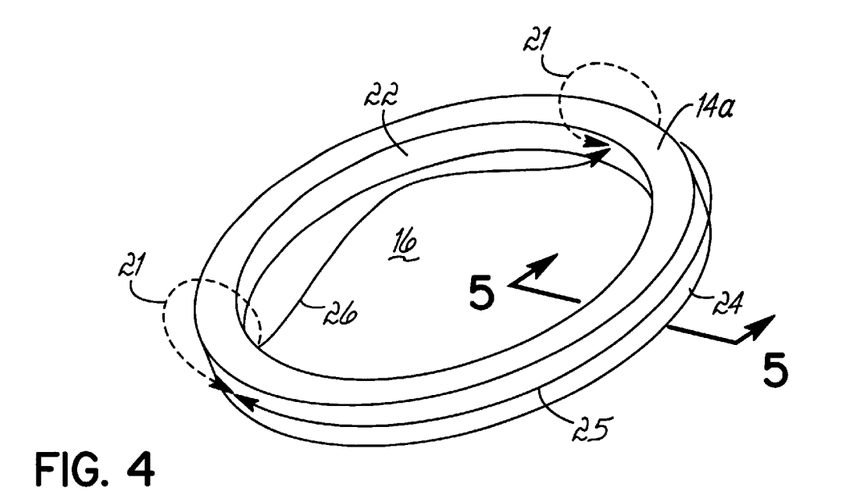
FIG. 4 is a perspective view of the magnet of FIG. 3 illustrating flux linkage with and without a yoke.
Figure 5A:
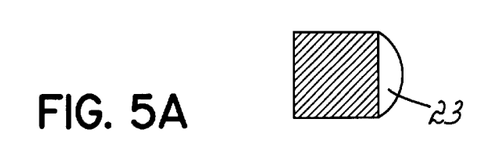
FIGS. 5A–5C are cross-sectional views taken along line 5—5 of FIG. 4 illustrating alternative yoke configurations.
Figure 5B:
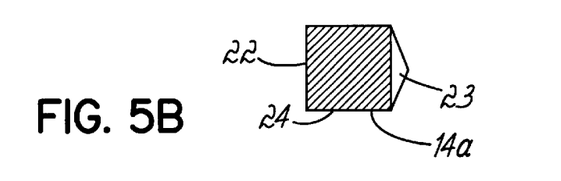
Figure 5C:
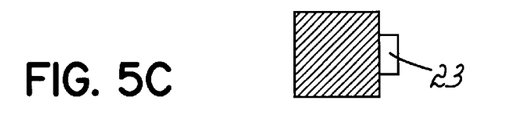

The efficiency of the magnet 14a, as defined as the field strength in the aperture 16, as compared to the mass of the magnet 14a, is seriously affected by fringing field effects, as shown by dashed lines 21 in FIG. 4. Instead of inside faces 22 of the magnet 14a being connected by field lines across the aperture 16, the inside faces 22 are connected to the outside faces as represented by the dashed field lines 21. The net result is a flux reduction in the aperture 16, i.e., reduced field strength. The fringing fields 21 can be reduced by adding a yoke 23 (FIG. 5A) on the outside 24 of the magnet 14a. With the yoke in place, some of the flux lines 25 originating on the outside 24 of the magnet 14a terminate on the opposite pole on the outside of the other side of the magnet instead of to the inside faces. This leaves their counterpart flux lines 26 on the inside face magnet to connect across the aperture to the opposite pole. This effect is shown by solid lines in FIGS. 5A–C. Modeling suggests that the effects of the yoke 23 may add up to 50% to the field strength in the aperture 16. A careful optimization of the shape of the yoke 23 may add another 5 to 10% to the field strength in the aperture 16. The goal of the optimization would be to maximize the path-length in non-magnetic materials that the flux lines connecting the inside faces 22 and outside faces 24 would have to cover, without bringing the yoke material into saturation. This translates into a requirement for a yoke with the smallest possible cross section, thick in the middle, thin or even not covering the magnet edge. Several possible yoke profiles are shown in FIGS. 5A–C. The details of the yoke profile influence the amount of flux that links the inside and outside faces of the magnet 14a.

As discussed above, waves are expected to be excited at the plasma edge in order for the total RF electron current to be zero at the boundary. This boundary condition need not necessarily always be satisfied. In case of conductive boundaries, for example, non-zero RF electron currents can exist at the plasma edge resulting in a suppression of the edge EC wave excitation. As a result, more of the RF power is channeled into the whistler wave, and channeled into the excitation of the EC wave at the mode conversion surface. Therefore, it is feasible that optimum performance of the source is achieved with an internal Faraday shield that suppresses direct excitation of EC waves at the plasma edge.

One concern in plasma sources with magnetic fields is the reduced plasma diffusion rate across the field lines. As a result, the majority of the plasma would remain trapped close to the mode conversion layer, and be lost at the chamber walls along the field lines connecting them to the mode conversion region. However, due to the curvature of the magnetic field lines, which is away from the RF source, the plasma is unstable and generates flows that will expel the plasma away from the source into the processing volume, as illustrated by arrows 20 in FIG. 3B.

Several alternative embodiments are possible. These include other ways of generating the required magnetic field, cross sections other than circular, and non-planar configurations. Alternative non-circular embodiments, based upon opening up of ring type sources, are also possible and are discussed below.

Figure 6:
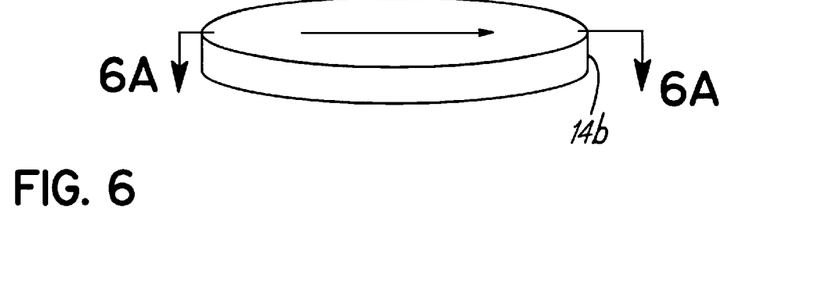
FIG. 6 is a perspective diagram of a planar magnet according to an alternative embodiment of the invention.
Figure 6A:
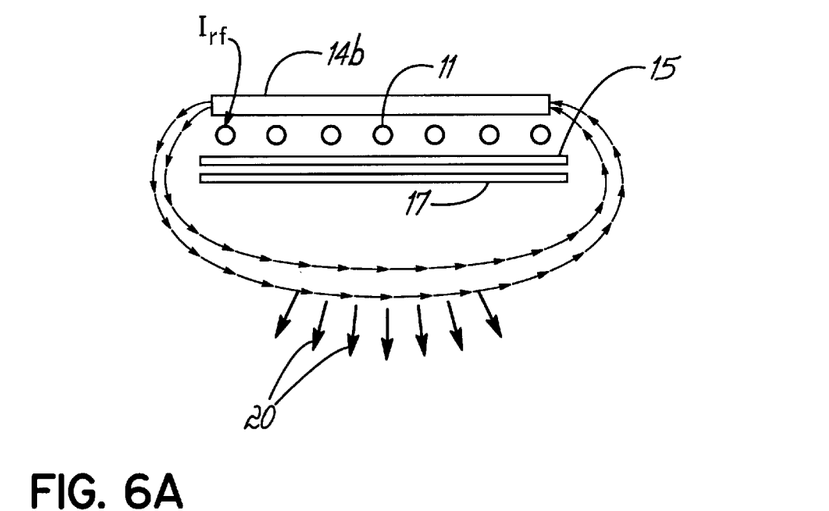
FIG. 6A is a cross-sectional view along line 6A—6A of FIG. 6.
Figure 6B:
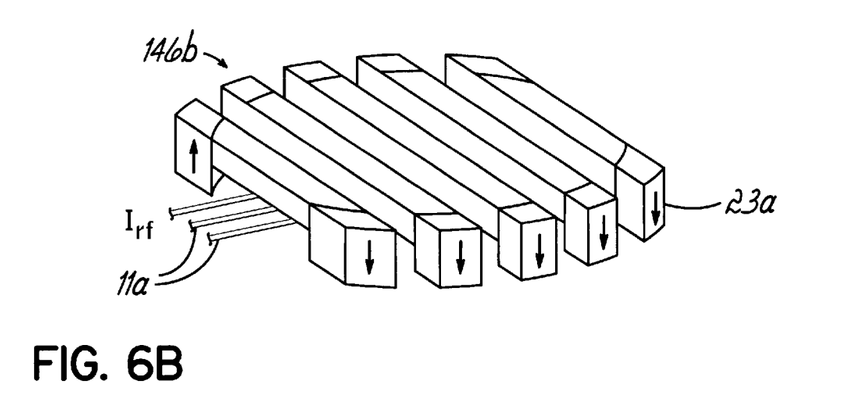
FIG. 6B is a perspective diagram illustrating a variation of the embodiment of FIG. 6.

Instead of the magnetic configuration of FIG. 3, a satisfactory field distribution is also obtained with a uniformly magnetized planar magnet 14b of circular cross section, as illustrated in FIG. 6, positioned behind the RF coils 11 in air, as illustrated in FIG. 6A. Because of the requirement of shielding the magnet 14b from the RF, this arrangement can, however, reduce the effectiveness of the RF coils 11. By replacing the planar magnet 14b of FIG. 6 with magnet bars 14bb oriented perpendicular to the conductors of the coil 11, as illustrated in FIG. 6B, the reduction of the effectiveness of the coil can be substantially prevented. Yoke elements 23a may be added to the bars 14bb. The bars 14bb may also be coated with a protective coating of a process-compatible, electrically-conductive material such as aluminum or copper, which prevents absorption of energy from the coil 11 by the magnet bars 14bb and the heating of the bars, and allows the magnet bars 14bb to function as a Faraday shield. Similarly, the yoke elements 23a may also be coated with electrically-conductive material.

Another embodiment is a combination of the ring magnet 14a with the planar magnet 14b or bar magnets 14bb. One should note that in this case, no continuous yoke should be used around the ring magnet 14a, as it would effectively short out the planar magnet 14b. An alternative embodiment is to use the planar magnet 14b as a subtractor, oriented to reduce the field strength of the ring magnet 14a, but also to flatten out the curvature of the flux lines in the plasma.

Designs can also be used to generate uniform fields $B_{DC}$ inside magnets 14c, 14d and 14e of respectively triangular (FIG. 7), square (FIG. 7A), hexagonal (FIG. 7B), or arbitrary polygonal cross section. The rules for design of these magnets are known; see Abele, M. G. (1993) *Structures of Permanent Magnets*, John Wiley & Sons. These shapes may be more practical as elements of arrays of sources, since with them one can achieve denser packing of the individual sources. These may be made of magnet elements having directions of magnetization illustrated by the arrows 18a in FIGS. 7, 7A and 7B. As with the circular source, they will benefit from the addition of a yoke on the outside of the magnetic structure.

The plasma sources discussed above can be described as compact in the sense that the source can be placed as a unit onto a vacuum chamber and that it contains no other openings into the chamber. Sources based on the excitation of EC waves from electro-magnetic waves need not be compact, as long as they satisfy the orthogonality condition between $E_{RF}$ and $B_{DC}$ shown in FIG. 1A.

Figure 8:
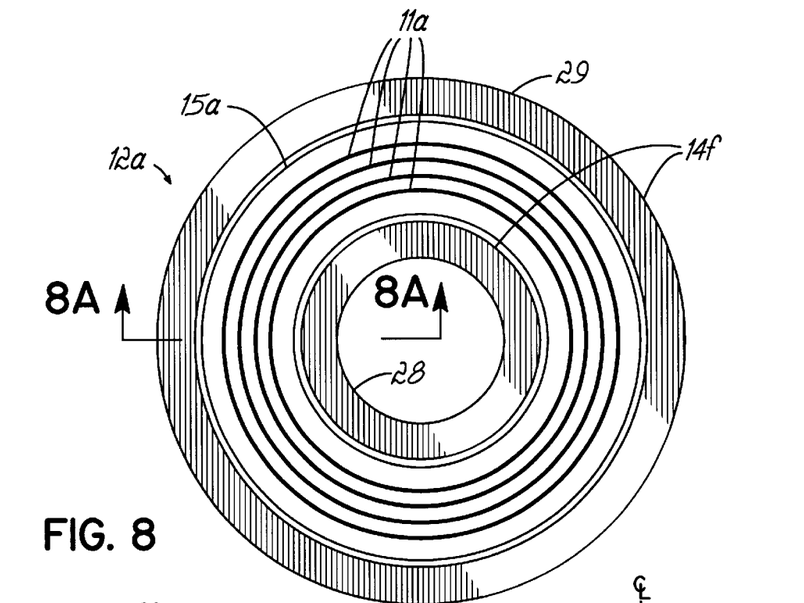
FIG. 8 is a top view of a ring type source according to an alternative embodiment of the invention.
Figure 8A:
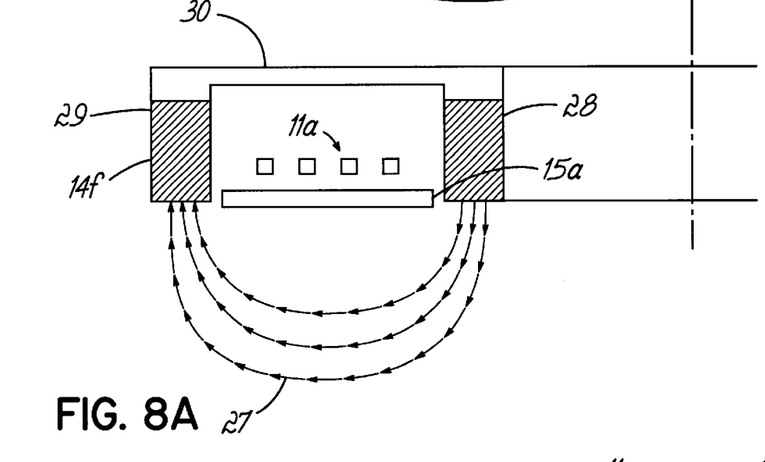
FIG. 8A is a cross-sectional view along line 8A—8A of FIG. 8.

A ring type source 12a is one example of these sources and is shown in FIGS. 8 and 8A. The source 12a has a ring shaped annular magnet 14f with inner and outer poles 28, 29, respectively adjacent inner and outer edges of an annular window 15a behind which is antenna 11a. A cross section of the source 12a is shown in FIG. 8A, which illustrates the location of a magnet 14f and magnetic field lines 27. Similarly to other sources described above, the magnet 14f has a yoke 30 joining the poles 28, 29. The magnet 14f and yoke 30 are shielded from the RF by thin copper or aluminum cladding. A ring-type source provides a more uniform plasma and also allows for the installation of auxiliary equipment such as gas feeds and showerheads in the center opening 16.

Figure 8B:
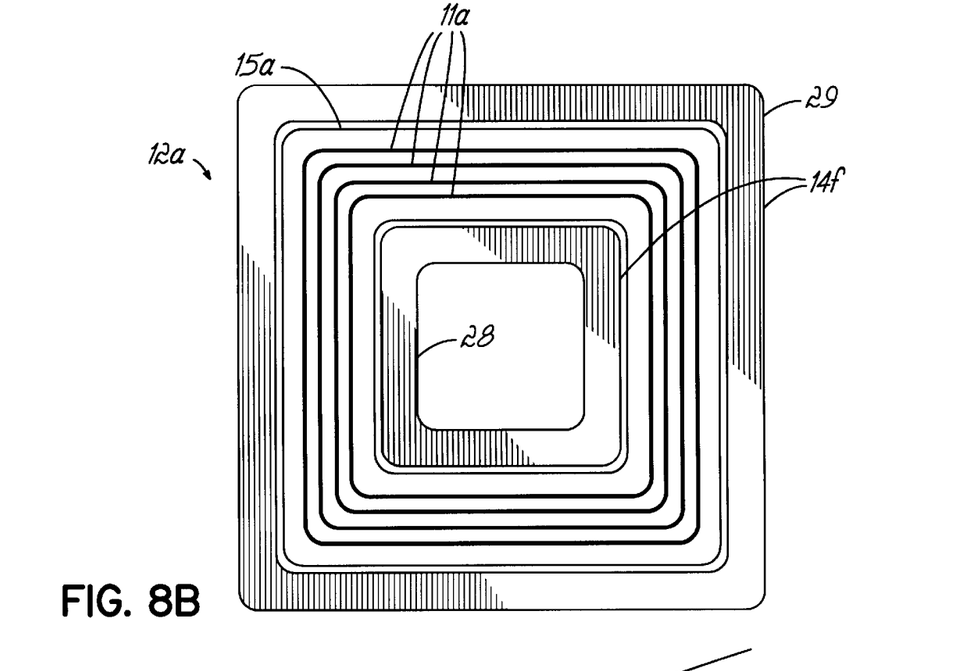
FIG. 8B is a top view similar to FIG. 8 of an alternative ring type source.

The source 12a can be distorted from the circular shape shown in FIG. 8. FIG. 8B shows a source with a square shape. Other shapes are possible. The ring type source 12a need not be planar; it can be frusto-conical as illustrated in cross section in FIG. 8C. As the angle β of the cone of a ring-type source increases (FIG. 8C), the source is wrapped around the chamber 32 and becomes a part of the chamber side wall (FIG. 8D), The chamber profile need not be cylindrical.

Such configurations may lead to very large dielectric windows that have to support large atmospheric loads. This may lead to engineering, cost, and manufacturing issues. It may be advantageous to build the dielectric window out of several sections, which are mounted on a rigid metal frame, with which they form a vacuum seal In order for the members of the frame not to interfere with RF field propagation, they should be perpendicular to the RF currents.

The sources discussed above are compact sources and ring sources. Open sources may also be used that are hybrids of the two sources, as illustrated in FIG. 8E. Open sources do not enclose a portion of the vacuum vessel as the ring sources do. On the other hand, their cross section is the same as those of the ring sources, These sources, especially arrays of them, may be suitable for large area plasma processing.

Figures 8C, 8D:
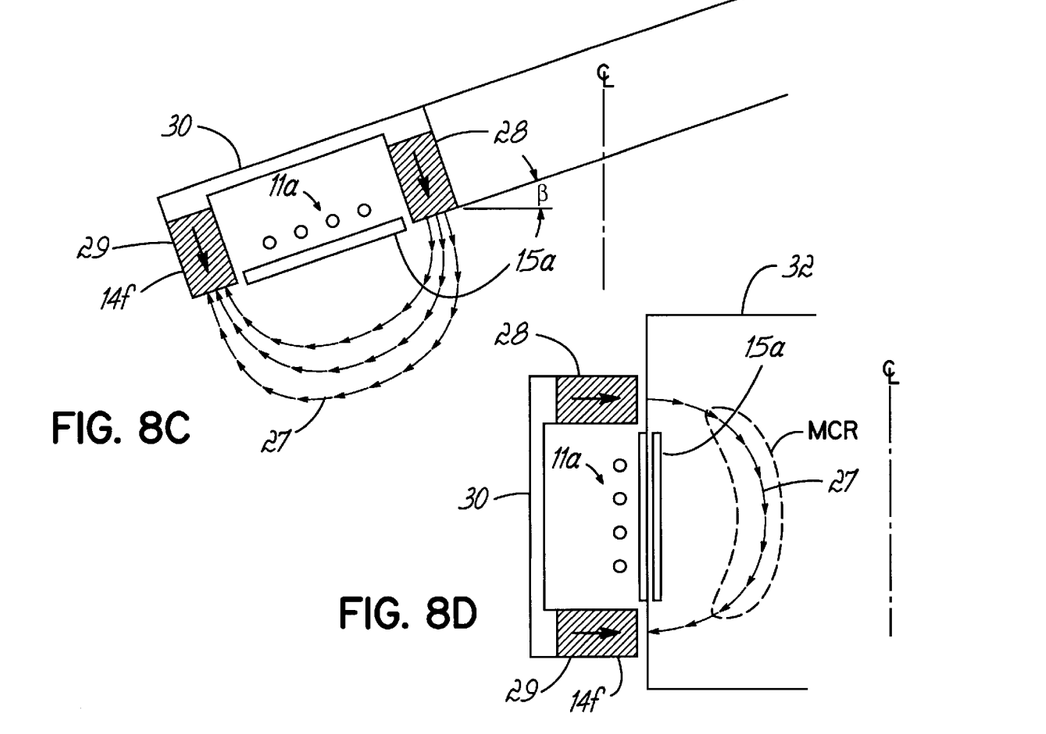
FIG. 8C is a cross-sectional view similar to FIG. 8A of another alternative ring type source.
FIG. 8D is a cross-sectional view similar to FIGS. 8A and 8C of still another alternative ring type source.
Figure 8E:
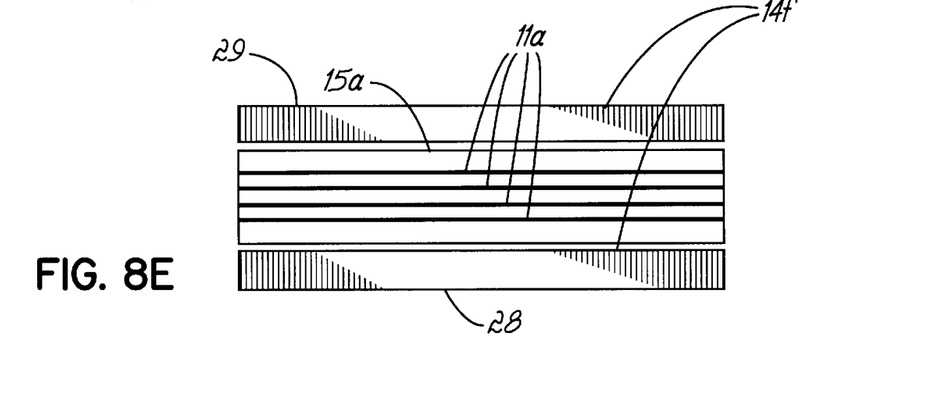
FIG. 8E is a top view similar to FIGS. 8 and 8B of an open source according to another alternative embodiment of the invention.
Figure 8F:
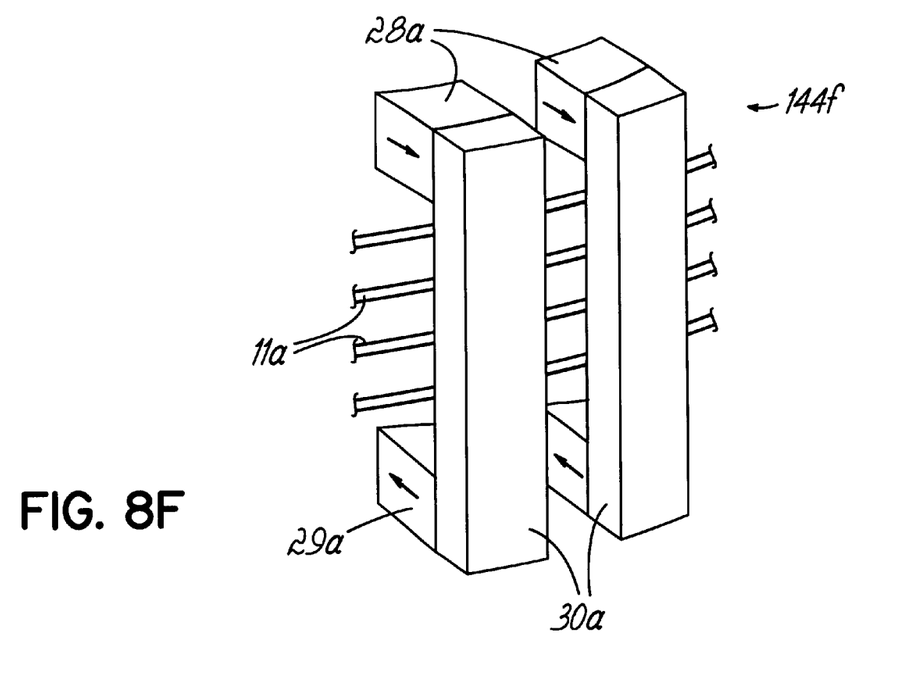
FIG. 8F is a perspective diagram, similar to FIG. 6, illustrating a variation of the embodiments of FIGS. 8–8E.

The effectiveness of the coil 11 can be improved in the embodiments of FIGS. 8–8E by segmenting the magnets 14f, including the poles 28 and 29 and the yoke 30 thereof, as illustrated in FIG. 8F in a manner similar to that described in connection with FIG. 6B above. In FIG. 8F, segmented magnets 14ff are shown formed of poles 28a,29a and yoke 30a.

Several of the embodiments presented so far can be used as elements of an array of sources. These can be advantageous for large area plasma processing, or to reduce the required magnetic field. From the mode conversion condition equation described above, for a given plasma density and RF frequency, the required magnetic field is proportional to the characteristic antenna dimension.

When combining multiple sources into an array, the magnetic field of all the sources can be aligned in the same direction. For some applications, it may be advantageous to assemble the sources so that the magnetic fields are in opposing directions. In this configuration, the fields at the substrate will be reduced over those in the configuration with parallel sources.

While the above description and accompanying drawings set forth various embodiments of the invention, it will be apparent to those skilled in the art that additions and modifications may be made without departing from the principles of the invention.

Accordingly, what is claimed is:

1. A method of energizing a high density plasma in a semiconductor wafer processing apparatus while maintaining a low intensity magnetic field at a substrate being processed by the plasma, comprising:
   launching a whistler wave through a dielectric window into a vacuum processing chamber;
   maintaining parameters in the chamber to exploit mode conversion of the whistler wave to an electro-static wave in the chamber;
   providing static magnetic field configuration in the chamber wherein the curvature of the magnetic field lines is such that plasma instabilities are excited that generate plasma flows that expel the plasma away from the dielectric window.

2. The method of claim 1 further comprising:
   providing a Faraday shield at the dielectric window and therewith suppressing edge excitation of the EC wave while permitting the launching a whistler wave therethrough.

3. The method of claim 1 wherein:
   the generating of the static magnetic field is carried out using a permanent magnet ring.

4. The method of claim 3 further comprising:
   reducing fringing fields by providing a yoke on the outside of the permanent magnet ring.

5. The method of claim 4 wherein:
   the yoke has a cross-section that is small relative to that of the magnet and is thicker at the middle of the magnet than toward the edges of the magnet.

6. The method of claim 1 wherein:
   the chamber is bounded by a chamber wall having an opening therein and the window is situated in the opening;
   the magnetic field strength in the opening is of the order of 100 to 200 Gauss;
   the opening has a diameter approximately in the range of 5 to 20 cm; and
   electron temperature is of the order of a few electron volts.

7. A method of energizing a high density plasma in a semiconductor wafer processing apparatus comprising:
   providing an RF plasma source that includes an RF generator connected to an RF antenna located outside of a dielectric window in the wall of a processing chamber of the apparatus;
   generating a static magnetic field that is generally uniform in a region extending from the dielectric window and into the chamber through a mode conversion region within the chamber that is spaced a distance from the window with the electron temperature $T_e$ in electron volts, the static magnetic field strength $B_{DC}$ in Gauss and gas pressure p in milliTorr in said region approximately satisfying the relation:

$$B_{DC} > 0.76 p \sqrt{T_e}$$

and with the magnetic field lines of $B_{DC}$ being curved so as to expel plasma in a direction away from the dielectric window;
   launching a whistler wave W from the antenna through the window and into the chamber with RF current $I_{RF}$ in the antenna perpendicular to $B_{DC}$ and the electric field $E_W$ of the whistler wave W perpendicular to $B_{DC}$, and with $E_W$ and $B_{DC}$ parallel to the plane of the dielectric window; and
   converting the whistler wave W to an EC wave by approximately satisfying the relationship in the mode conversion region among the characteristic antenna wavelength $\lambda$ in centimeters, the frequency f of the generator in Hertz, the local static magnetic field strength B in Gauss and the plasma density $n_e$ in electrons per square centimeter at:

$$\lambda = \frac{4.7 \times 10^{12} B}{\sqrt{n_e f}}.$$

8. The method of claim 7 further comprising:
   providing a conductive boundary at the dielectric window and therewith suppressing edge excitation of the EC wave while permitting the launching of the whistler wave therethrough.

9. The method of claim 7 wherein:
   the generating of the static magnetic field is carried out using a permanent magnet ring.

10. The method of claim 7 wherein:
    the magnetic field strength in the opening is of the order of 100 to 200 Gauss;
    the opening has a diameter approximately in the range of 5 to 20 cm; and
    electron temperature is of the order of a few electron volts.

11. A semiconductor wafer processing apparatus comprising:
    a vacuum processing chamber having a wall with an opening therein;
    a dielectric window in the opening;
    an RF source outside of the chamber adjacent the window that is operable to launch an EC wave through a dielectric window into a vacuum processing chamber; and
    permanent magnets configured to provide static magnetic field configuration in the chamber wherein the curvature of the magnetic field lines is such that plasma instabilities are excited that generate plasma flows that expel plasma away from the dielectric window.

12. The apparatus of claim 11 further comprising:
    a yoke on the outside of the permanent magnet ring.

13. The apparatus of claim 12 wherein:
    the yoke has a cross-section that is small relative to that of the magnet and is thicker at the middle of the magnet than toward the edges of the magnet.

14. The apparatus of claim 11 wherein:

the magnets are configured to produce a magnetic field strength in the opening of the order of 100 to 200 Gauss; and the opening has a diameter approximately in the range of 5 to 20 cm.

15. The apparatus of claim 11 further comprising:

a conductive boundary at the dielectric window configured to suppress edge excitation of the EC wave.

16. The apparatus of claim 11 wherein:

the RF plasma source includes an RF generator and an RF antenna connected to the RF generator and located outside of the dielectric window;

the static magnetic field is generally uniform in a region extending from the dielectric window and into the chamber through a mode conversion region within the chamber that is spaced a distance from the window with the electron temperature $T_e$ in electron volts, the static magnetic field strength $B_{DC}$ in Gauss and gas pressure p in milliTorr in said region approximately satisfying the relation:

$B_{DC} > 0.76 p \sqrt{T_e}$ and with the magnetic field lines of $B_{DC}$ being curved so as to expel plasma in a direction away from the dielectric window;

the antenna and chamber are configured such that a whistler wave W launched from the antenna through the window and into the chamber with RF current $I_{RF}$ in the antenna perpendicular to $B_{DC}$ produces an electric field $E_W$ of the whistler wave W that is perpendicular to $B_{DC}$, with $E_W$ and $B_{DC}$ parallel to the plane of the dielectric window and approximately satisfying the relationship in the mode conversion region among the characteristic antenna wavelength λ in centimeters, the frequency f of the generator in Hertz, the local static magnetic field strength B in Gauss and the plasma density $n_e$ in electrons per square centimeter of;

$$\lambda = \frac{4.7 \times 10^{12} B}{\sqrt{n_e f}}.$$

* * * * *

UNITED STATES PATENT AND TRADEMARK OFFICE
CERTIFICATE OF CORRECTION

PATENT NO. : 6,771,026 B2
DATED : August 3, 2004
INVENTOR(S) : Mirko Vukovic

It is certified that error appears in the above-identified patent and that said Letters Patent is hereby corrected as shown below:

Column 4,
Line 46, reads "...has been recognized. its importance in the generation of a...." and should read -- ...has been recognized, its importance in the generation of a.... --.

Column 5,
Line 62, reads "$B_{DC}[G]>0.76p[mToor]$..."and should read -- $B_{DC}[G]>0.76p[mTorr]$... --.

Column 6,
Line 1, reads "...a mode conversion source. Whistlerwave W is launched by..." and should read -- ...a mode conversion source. Whistler wave W is launched by... --.

Column 8,
Line 43, reads "...side wall (FIG. 8D), The chamber profile need not be..." and should read -- ...side wall (FIG. 8D). The chamber profile need not be... --.
Line 50, reads "...with which they form a vacuum seal In order for the..." and should read -- ...with which they form a vacuum seal. In order for the... --.

Column 12,
Line 16, reads "...density $n_e$ in electrons per square centimeter of;" and should read -- ...density $n_e$ in electrons per square centimeter of: --.

Signed and Sealed this

Twenty-third Day of August, 2005

JON W. DUDAS
*Director of the United States Patent and Trademark Office*